United States Patent
Drost et al.

(10) Patent No.: US 9,287,439 B1
(45) Date of Patent: Mar. 15, 2016

(54) METHOD OF CONDITIONING THE CDTE LAYER OF CDTE THIN-FILM SOLAR CELLS

(71) Applicants: China Triumph International Engineering Co., Ltd., Shanghai (CN); CTF Solar GmbH, Dresden (CN)

(72) Inventors: Christian Drost, Leipzig (DE); Bastian Siepchen, Dresden (DE); Shou Peng, Shanghai (CN)

(73) Assignee: China Triumph International Engineering Co., Ltd., Shanghai (CN)

( * ) Notice: Subject to any disclaimer, the term of this patent is extended or adjusted under 35 U.S.C. 154(b) by 0 days.

(21) Appl. No.: 14/687,936

(22) Filed: Apr. 16, 2015

(51) Int. Cl.
*H01L 31/18* (2006.01)
*H01L 21/02* (2006.01)

(52) U.S. Cl.
CPC ...... *H01L 31/1864* (2013.01); *H01L 21/02562* (2013.01); *H01L 31/1828* (2013.01)

(58) Field of Classification Search
None
See application file for complete search history.

(56) References Cited

U.S. PATENT DOCUMENTS

| | | | | |
|---|---|---|---|---|
| 9,117,956 | B2* | 8/2015 | Clark | H01L 31/073 |
| 2004/0094721 | A1* | 5/2004 | Tokuda | G01T 1/24 |
| | | | | 250/370.13 |
| 2011/0139249 | A1* | 6/2011 | Garnett | H01L 21/02422 |
| | | | | 136/260 |
| 2013/0078757 | A1* | 3/2013 | Foust | H01L 31/022425 |
| | | | | 438/95 |
| 2013/0280854 | A1* | 10/2013 | Jasieniak | B82Y 30/00 |
| | | | | 438/93 |
| 2014/0261687 | A1* | 9/2014 | Damjanovic | H01L 31/0296 |
| | | | | 136/260 |

FOREIGN PATENT DOCUMENTS

DE    102014202847 A1 *  8/2015    .......... H01L 31/1864

OTHER PUBLICATIONS

Drost et al. Activation of CdTe-based thin films with zinc chloride and tetrachlorozincates, Thin Solid Films 582 (May 1, 2015) 100-104.*

* cited by examiner

*Primary Examiner* — Andres Munoz
(74) *Attorney, Agent, or Firm* — Michael Soderman

(57) ABSTRACT

The invention relates to a method for conditioning the CdTe layer of CdTe thin-film solar cells without the use of CdCl2. Calcium tetrachlorozincate (CaZnCl4) is to be used instead of CdCl2 for activation, and the process parameters that have proven themselves over time are to be kept. The method involves the activation of the CdTe layer of semi-finished thin-film CdTe solar cells; calcium tetrachlorozincate is applied to the CdTe layer (4) and the semi-finished thin-film CdTe solar cell subsequently undergoes a heat treatment. The calcium tetrachlorozincate layer is preferably applied via methods from the prior art, for instance roller coating with an aqueous or methanolic salt solution, spraying on an aqueous or methanolic salt solution, an aerosol coating or a dipping bath.

11 Claims, 2 Drawing Sheets

METHOD OF CONDITIONING THE CDTE LAYER OF CDTE THIN-FILM SOLAR CELLS

CROSS-REFERENCE TO RELATED APPLICATIONS

Not applicable

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

Figure 1:
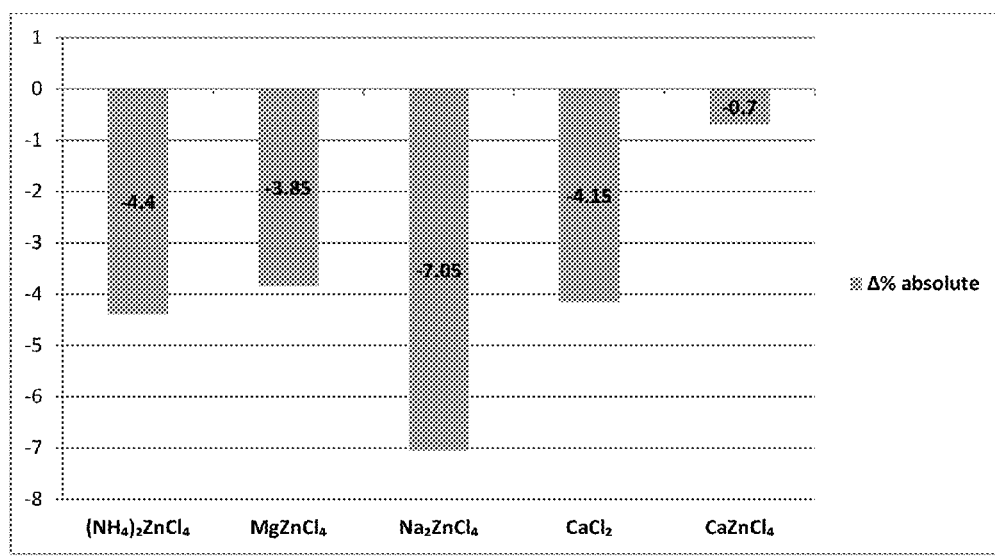

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable

BACKGROUND OF THE INVENTION (1) Field of the Invention

The present invention relates to a method for conditioning the CdTe layer of CdTe thin-film solar cells without the use of $CdCl_2$.

(2) Description of Related Art Including Information Disclosed Under 37 CFR 1.97 and 1.98

The production of superstrate configuration CdTe thin-film solar cells according to the state of the art involves the application of a transparent front contact layer (TCO, i.e. transparent conductive oxide) onto a substrate (preferably glass). The front contact layer may also be a layer stack consisting of several different layers. A layer of pure or modified CdS (cadmium sulfide) is deposited onto that. Modified CdS (cadmium sulfide) is henceforth understood to be CdS with doping, variations in the crystal shape or in grain sizes, or as a mixture of CdS with other substances. A layer of CdTe (cadmium telluride) is applied on top of the CdS layer. The back contact layer, or back layer sequence, is in turn deposited onto the CdTe layer.

An issue arising from this is the difficulty of applying a metallic contact layer onto the CdTe, since this would create a rectifying Schottky contact. What is desired, however, is the creation of an ohmic contact. An interface layer sequence is therefore used in the prior art. Its object is to realize the approximation of energy levels of the individual layer materials so that an ohmic contact is created, with a metallic layer being the preferred top back contact layer.

After the CdTe is applied during the production process in the prior art, there is usually an activation of CdTe follows by means of $CdCl_2$ and heating. To this end, a $CdCl_2$ layer is applied to the CdTe layer using (preferably wet-chemical or using CVD or PVD) methods according to the state of the art. Afterwards, the $CdCl_2$ is left to react with the CdS/CdTe layer stack at a raised temperature (usually about 380° C. to 430° C.). Reaction time is about 15 minutes to 45 minutes. Here the $CdCl_2$ acts as fluxing agent and supports a recrystallization of the CdTe layer.

After activation, any surplus $CdCl_2$ is rinsed off from the layer surface using deionized water. A problem arising from the activation process according to the state of the art is that $CdCl_2$ is an easily water-soluble, toxic chemical and highly hazardous for the environment. It has been shown to have carcinogenic and mutagenic properties, and it is toxic for reproduction. These properties require special care in handling when processing the $CdCl_2$ in the production process. Furthermore, the generated contaminated waste water requires costly cleaning or waste disposal.

Thus the object consists in replacing the $CdCl_2$ used in the process with a safer, and easier to handle substance, yet at the same time largely maintaining the process parameters for layer activation.

BRIEF SUMMARY OF THE INVENTION

The present invention describes a method for activating the CdTe layer of semi-finished thin-film CdTe solar cells, in which the $CdCl_2$ used in prior art is replaced by a safer and easier to handle substance, whereby the process parameters for activation are largely maintained. This is achieved by applying calcium tetrachlorozincate onto the CdTe layer and the subsequent heat treatment of the semi-finished thin-film CdTe solar cells.

BRIEF DESCRIPTION OF THE SEVERAL VIEWS OF THE DRAWING(S)

FIG. 1 shows a comparison of the achieved differences in electric efficiency of solar cells activated using various derivatives of zinc chloride or calcium chloride, in contrast to solar cells activated using a standard $CdCl_2$ solution. The minor difference in electric efficiency in $CaZnCl_4$ is remarkable, in relation to that of the other compounds investigated.

FIGS. 2 to 6 schematically show the sequence of process steps, including the activation step according to the invention using calcium tetrachlorozincate.

Figure 2:
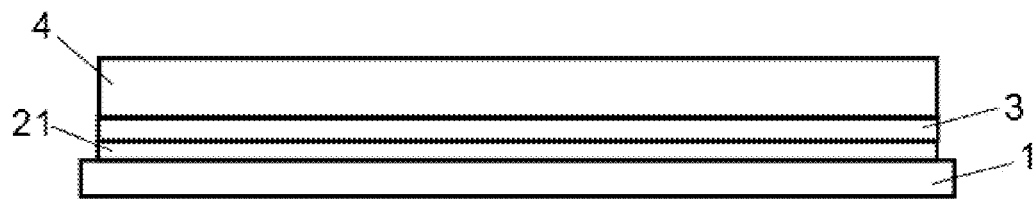

FIG. 2 shows the prepared solar cell with the substrate (1), onto which the transparent front contact (21) and the CdS layer (3), with the CdTe layer (4) on top, have already been applied.

Figure 3:
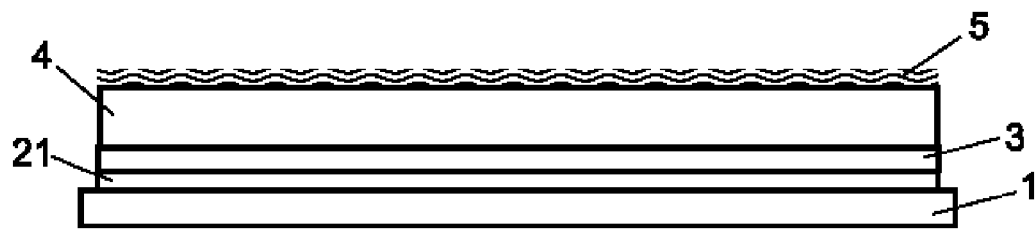

FIG. 3 schematically shows the application of the calcium tetrachlorozincate (5).

Figure 4:
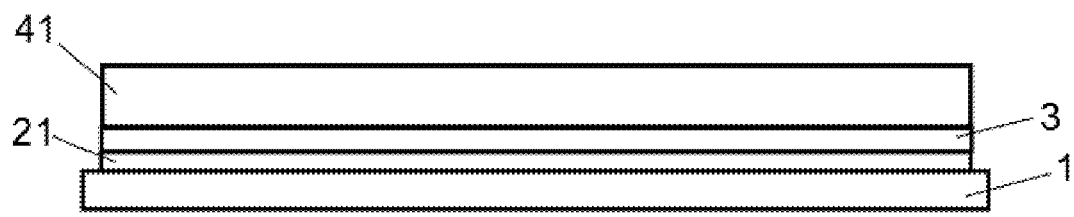

As schematically shown in FIG. 4, after the activation process an activated CdTe layer (41) remains.

Figure 5:
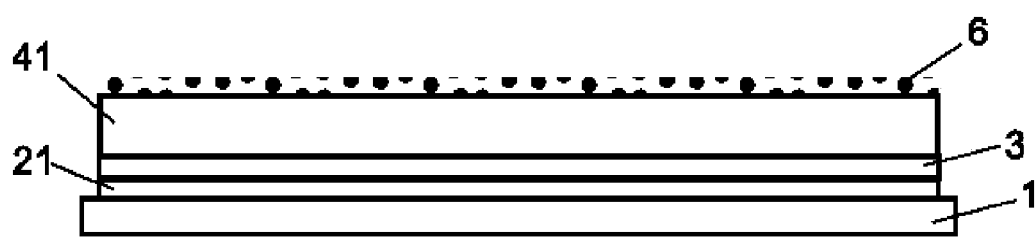

FIG. 5 schematically shows the etching step after the activation process.

Figure 6:
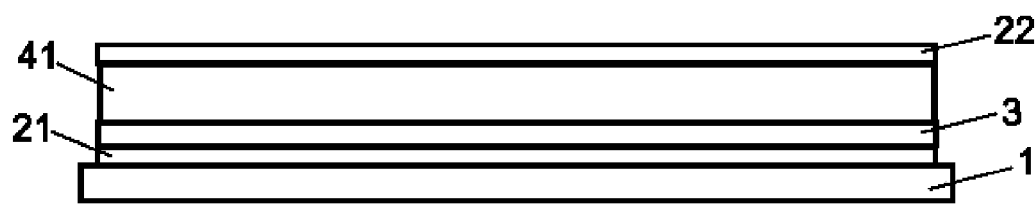

FIG. 6 schematically shows the layer sequence of the finished solar cell after applying the Au layer (22) of the back contact onto the CdTe layer (41).

DETAILED DESCRIPTION OF THE INVENTION

According to the invention, the object is achieved using the method according to claim 1. Advantageous embodiments are disclosed in the corresponding dependent sub-claims.

The inventors have conducted research investigating various less toxic and non-carcinogenic, respectively non-mutagenic, chemical compounds, which also react as fluxing agents in the activation process. Calcium chloride, zinc chloride hydrate, adducts of zinc chloride, in particular tmeda.$ZnCl_2$ (tmeda: tetramethylethylenediamine), and tetrachlorozincates, particularly $(NH_4)_2ZnCl_4$, and further double salts containing zinc and chloride ions were investigated in a series of trials. In those parameter ranges largely corresponding to the parameters of the existing activation process, however, most of the investigated compounds proved to be unsuitable. No results regarding efficiency, electric characteristics, and reproducibility were achieved for these compounds which would be comparable to the results obtained by a solar cell produced by means of a $CdCl_2$ activation process. Surprisingly, however, calcium tetrachlorozincate ($CaZnCl_4$) has proven suitable, with the parameters to be used (temperature, duration of activation) matching those of $CdCl_2$ activation.

In FIG. 1 the absolute differences in electric efficiency (in percent) obtained in the trial series are shown for activation using different fluxing agents [$(NH_4)_2ZnCl_4$, $MgZnCl_4$, $Na_2CaCl_4$, $CaCl_2$ and $CaZnCl_4$] as compared to standard activations using $CdCl_2$.

The invention therefore envisages the use of calcium tetrachlorozincate ($CaZnCl_4$) instead of $CdCl_2$ for activation, and the retention of the tried and tested process parameters. This has the advantage of making any process changes unnecessary.

The layer of calcium tetrachlorozincate ($CaZnCl_4$) is preferably applied using methods from the state of the art. Suitable methods are, e.g.:

roller coating with an aqueous or methanolic salt solution,
spraying an aqueous or methanolic salt solution,
aerosol coating,
dipping bath.

Producing the calcium tetrachlorozincate preferably takes place in situ by mixing the starting materials in a solvent. This may be achieved, for instance, by dissolving equimolar amounts of $CaCl_2.2H_2O$ and $ZnCl_2$ in deionized water, whereby the calcium tetrachlorozincate ($CaZnCl_4$) is formed in the solution. At a preferred mixing ratio of the starting materials $CaCl_2.2H_2O$ and $ZnCl_2$ of 1:2, formally $CaZn_2Cl_6$ is formed, which, in terms of the invention, is also understood by the term "calcium tetrachlorozincate".

Preferably, an aqueous solution containing the calcium tetrachlorozincate is applied to the CdTe layer. However, the water-enriched calcium tetrachlorozincate ($CaZnCl_4$ ($\times H_2O$)) may also be dissolved in methanol.

The calcium tetrachlorozincate is preferably present in a 20% to 40% solution, particularly preferably in a 30% solution.

Preferably the calcium tetrachlorozincate is applied to an unheated semi-finished CdTe solar cell, i.e. a semi-finished CdTe solar cell at room temperature. According to a further preferred embodiment, the semi-finished CdTe solar cell is heated up to a higher temperature, e.g. 60° C., before or during the application of the calcium tetrachlorozincate.

The application of the layer of calcium tetrachlorozincate onto the semi-finished CdTe solar cell is followed by the heat treatment required for activating the CdTe layer, at temperatures which are preferably between 350° C. and 450° C., and between 380° C. and 430° C. as a special preference. Treatment time ranges preferably from 15 minutes to 45 minutes, and from 20 minutes to 30 minutes as a special preference.

The CdTe layer recrystallizes because of the activation. Using the calcium tetrachlorozincate at the temperatures applied during heat treatment advantageously results in less mixing of the CdS layer with the CdTe layer. A very high degree of mixing of these layers involving the inclusion of sulfur into the CdTe crystals, the so-called over-activation of the CdTe layer, would have an unfavorable effect on the properties of the CdTe solar cell. Since this effect is less pronounced when using calcium tetrachlorozincate, the temperature range of the heat treatment may be widened. This results in a simplified process control when compared with that using $CdCl_2$.

A rinsing step using deionized water and a drying process, both corresponding to the process steps in $CdCl_2$ activation, are preferably carried out after heat treatment.

An optional step to eliminate any residual calcium tetrachlorozincate not yet removed by the previous rinsing may be carried out. To this end, rinsing with HCl is used, followed by another rinsing step using deionized water, and a drying step.

Subsequently, a standard etching step preferably takes place, for example with the well-known nitric-phosphoric acid etching solution, to treat the activated cadmium telluride layer.

After the following rinsing using deionized water, and after drying the semi-finished CdTe solar cell, a gold (Au) layer is applied using methods from prior art, preferably by sputtering. However, it is also possible to use other materials known from prior art for the back contact of the CdTe solar cell, for instance $Sb_2Te_3$, molybdenum and nickel containing further admixtures, and layer sequences made from various contact layers.

DETAILED DESCRIPTION OF THE PREFERRED EMBODIMENTS

In what follows, the process according to the invention is demonstrated by means of an exemplary embodiment, without intending to imply a restriction to said embodiment.

After applying the front contact layer (21), the CdS layer (3) and the CdTe layer (4) onto the glass substrate (1) (FIG. 2), calcium tetrachlorozincate ($CaZnCl_4$) is deposited onto the CdTe layer (4) (FIG. 3). In this process, equimolar proportions of the starting materials $CaCl_2.2H_2O$ and $ZnCl_2$ are dissolved in a set amount of deionized water, resulting in a 30% solution (5) containing a water-enriched calcium tetrachlorozincate ($CaZnCl_4(H_2O)_x$). This solution is applied onto the CdTe layer (4) by roller coating using a sponge roller. At this stage the semi-finished CdTe solar cell has room temperature.

The layer thus created on the CdTe layer (4) containing calcium tetrachlorozincate has a waxy consistency, so that neither a drying step nor blowing off any excess solution is necessary.

After this, the layer stack undergoes a heat treatment at 400° C. for 25 minutes which activates the CdTe surface layer in the process, resulting in an activated CdTe layer (41) (FIG. 4).

After cooling down the semi-finished CdTe solar cell, a rinsing step using deionized water and a subsequent drying step follow.

Subsequently, a nitric-phosphoric (NP) etching step (FIG. 5) using a nitric-phosphoric (NP) etching solution (6) [($HNO_3$ (3%)/$H_3PO_4$ (75%)/$H_2O$ (22%)] is carried out at a temperature of 20° C. for 30 seconds. To this end, the semi-finished CdTe solar cell is dipped into the NP etching solution (6). A Te-rich area with a thickness in the range of 1 nm to 300 nm is formed on the surface of the activated After rinsing with deionized water and subsequent drying, an Au layer (22) is applied onto the Te-rich area of the activated CdTe layer (41) by sputtering at room temperature, thereby creating the back contact (FIG. 6).

LIST OF REFERENCE NUMERALS

1 Substrate (glass)
21 Front contact (transparent, TCO)
22 Au back contact
3 CdS layer (pure or modified CdS (cadmium sulfide))
4 CdTe layer
41 activated CdTe layer
5 Layer or solution containing calcium tetrachlorozincate
6 Etching solution

The invention claimed is:

1. A method for activating a CdTe layer of a semi-finished thin-film CdTe solar cell, wherein calcium tetrachlorozincate is applied to the CdTe layer and the semi-finished thin-film CdTe solar cell subsequently undergoes a heat treatment.

2. The method according to claim 1, wherein the calcium tetrachlorozincate is present in an aqueous solution.

3. The method according to claim 2, wherein the calcium tetrachlorozincate is present in a solution of 20% to 40%.

4. The method according to claim 3, wherein the calcium tetrachlorozincate is present in a solution of 30%.

5. The method according to claim 1, wherein the calcium tetrachlorozincate is present in a methanolic solution.

6. The method according to claim 5, wherein the calcium tetrachlorozincate is enriched with water.

7. The method according to claim 1, wherein the calcium tetrachlorozincate is applied onto the CdTe layer by means of roller coating, or by spraying a solution containing the calcium tetrachlorozincate, or by means of aerosol coating or by means of dipping the semi-finished thin-film CdTe solar cell into a solution containing the calcium tetrachlorozincate.

8. The method according to claim 1, wherein the heat treatment is carried out at a temperature in the range between 350° C. and 450° C.

9. The method according to claim 8, wherein the heat treatment is carried out at a temperature in the range between 380° C. and 430° C.

10. The method according to claim 1, wherein the heat treatment is carried out for a duration in the range between 15 minutes and 45 minutes.

11. The method according to claim 10, wherein the heat treatment is carried out for a duration in the range between 20 minutes and 30 minutes.

* * * * *